United States Patent [19]

Beitner

[11] 4,355,518

[45] Oct. 26, 1982

[54] REFRIGERATOR-VEHICLE COMBINATION METHOD

[75] Inventor: Shlomo Beitner, Tel-Aviv, Israel

[73] Assignee: Bipol Ltd., Tel-Aviv, Israel

[21] Appl. No.: 178,924

[22] Filed: Aug. 18, 1980

[51] Int. Cl.³ .............................................. F25B 21/02
[52] U.S. Cl. ............................................. 62/3; 62/240
[58] Field of Search ................... 62/3, 240; 440/88; 114/211

[56] References Cited

U.S. PATENT DOCUMENTS

| | | | |
|---|---|---|---|
| 2,382,218 | 8/1945 | Fernstrum | 440/88 |
| 2,682,852 | 7/1954 | Ruffolo | 440/88 |
| 2,910,836 | 11/1959 | Karrer | 62/3 |
| 3,077,743 | 2/1963 | Castro et al. | 62/3 |
| 3,138,934 | 6/1964 | Roane | 62/3 |
| 3,212,274 | 10/1965 | Eidus | 62/3 |
| 3,216,205 | 11/1965 | Milligan et al. | 62/3 |
| 3,374,830 | 3/1968 | O'Sullivan, Jr. | 62/3 X |
| 3,451,641 | 6/1969 | Leventhal | 62/3 |
| 3,452,701 | 7/1969 | Lane | 440/88 X |
| 3,477,238 | 11/1969 | Race | 62/3 |
| 3,695,208 | 10/1972 | Fixler | 114/211 |
| 3,740,959 | 6/1973 | Foss | 62/3 |
| 3,874,183 | 4/1975 | Tabet | 62/3 |

Primary Examiner—Lloyd L. King
Attorney, Agent, or Firm—Gordon W. Hueschen

[57] ABSTRACT

There is disclosed a watercraft having a refrigerator powered by a thermo-electric element in which the hot face of the thermo-electric element is in direct contact with the water or air or in direct contact with the external wall of the watercraft or is in heat-transfer contact therewith through an external thermal sink having a face exposed to the ambient medium or in heat transfer therewith through the exterior wall. The external thermal sink can be a channel-shaped member, a solid block of heat-conducting metal, a heat pipe, or any energy-transfer device. The external thermal sink can be located entirely below the waterline or entirely above the waterline or adjacent to the waterline so that, in the first case, cooling is effected by heat transfer into the ambient water, in the second case by heat transfer into the ambient atmosphere and, in the third case, by the combined effects of these two, plus transfer of latent heat of vaporization of water resulting from water lapped or splashed on the external thermal sink.

18 Claims, 9 Drawing Figures

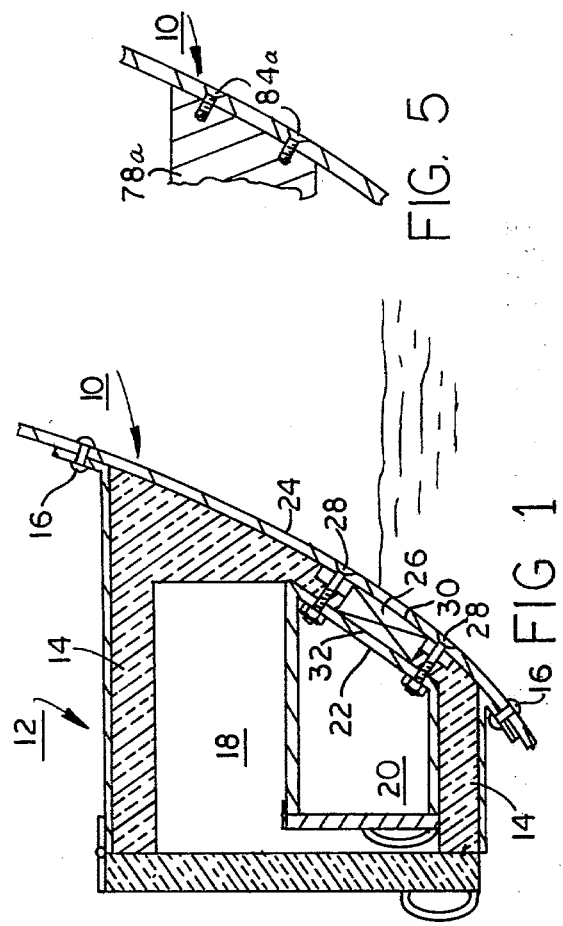
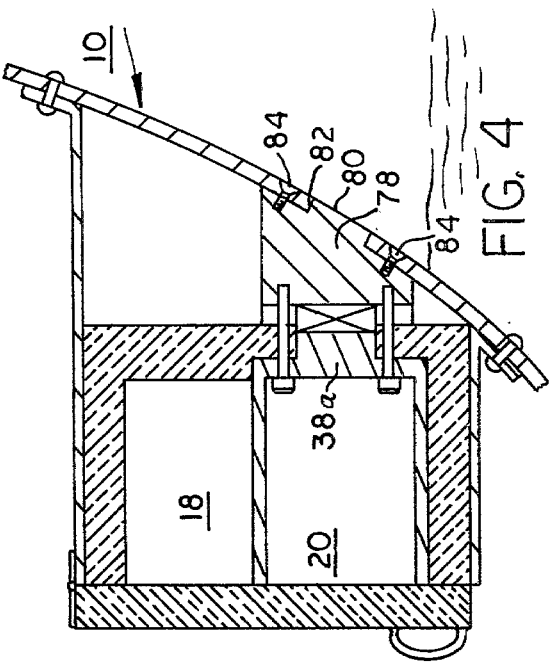
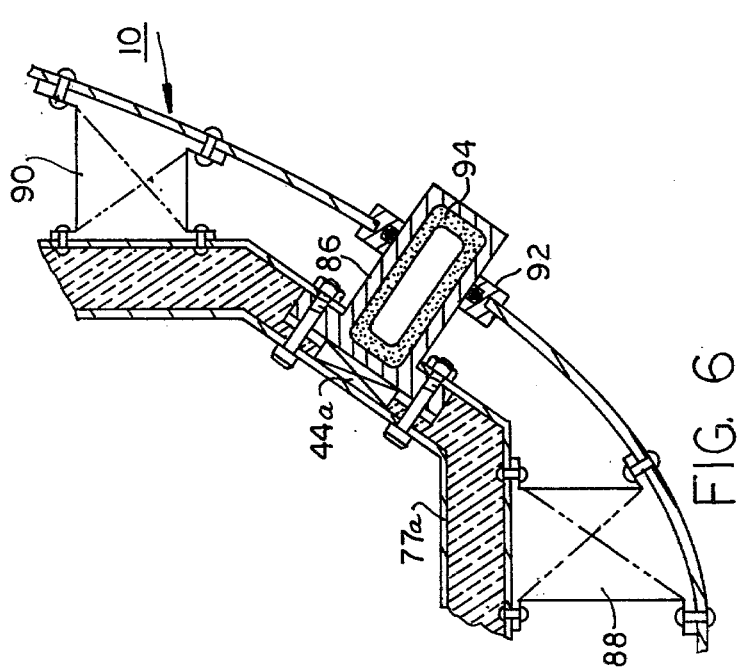
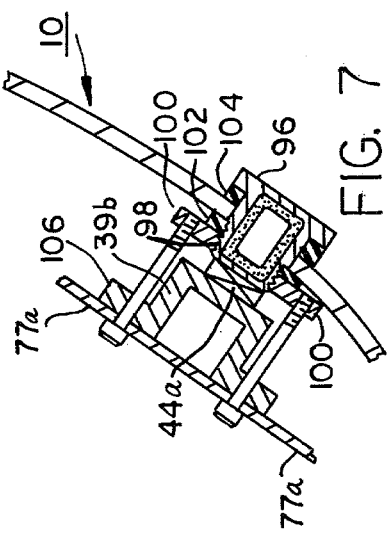

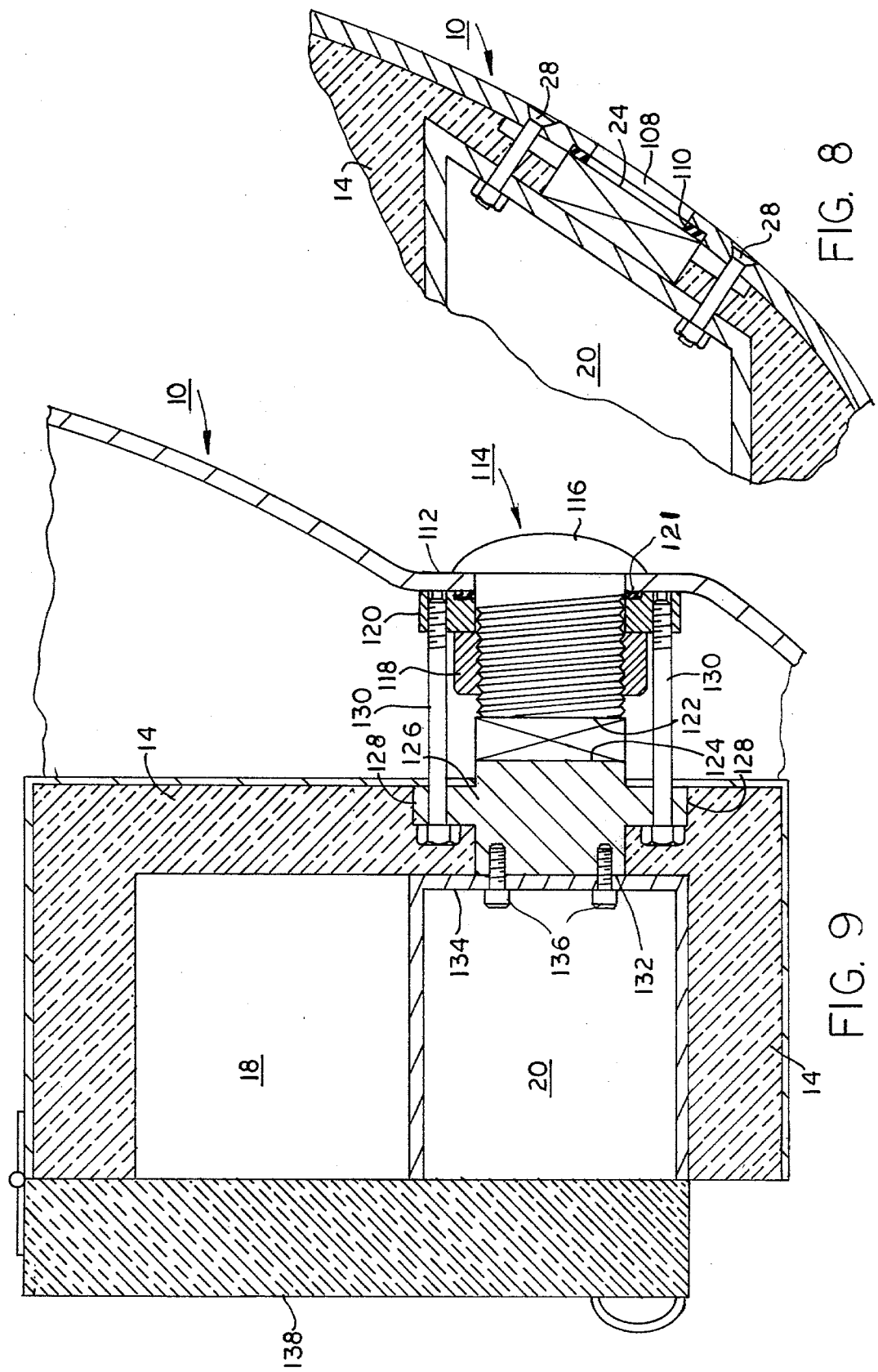

REFRIGERATOR-VEHICLE COMBINATION METHOD

FIELD OF INVENTION AND PRIOR ART

This invention relates to a vehicle which is enveloped by an ambient medium, such as atmospheric air or water, and is particularly directed to means or method for effecting refrigeration therein by means of a thermo-electric element having a hot face and a cold face formed by imposing a direct current potential across the faces.

In U.S. Pat. No. 4,107,934 and in the patents cited therein during the prosecution thereof, are shown portable refrigerator units powered by a thermo-electric element actuated by a direct current potential, such as can be obtained from a car, boat, or like vehicle. Such portable units have the disadvantage, however, that a great deal of heat is liberated, which causes discomfort and loss of efficiency when the unit is operated in a confined space, such as an automobile, an aircraft, or a boat.

OBJECTS OF THE INVENTION

It is an object of the invention to provide a combined vehicle and thermo-electric unit in which the heat generated by the thermo-electric unit is dissipated into the enveloping medium. Another object of the invention is to provide an efficient refrigerator unit for a watercraft. It is a further object of the invention to provide a combination of the class described in which cooling is effected by heat transfer from the hot face of the thermo-electric unit into a plurality of enveloping media. It is a further object of the invention to provide a combination of the class described in which the heat transfer is augmented by the heat of vaporization of water.

Further objects of the invention are to avoid the disadvantages of the prior art and to obtain such advantages as will appear as the description proceeds.

BRIEF DESCRIPTION OF THE INVENTION

The invention is directed to a vehicle which is enveloped by an ambient medium, such as atmospheric air or ambient water, and is particularly directed to a means or method for effecting refrigeration therein by use of a thermo-electric element having a hot face and a cold face actuated by imposing a direct current potential across the faces, which comprises heat-transfer means or step in association with said hot face and an exterior wall of said vehicle for cooling the hot face by conducting heat therefrom to the outside of said exterior wall and into the medium enveloping the outside of said exterior wall. A preferred way of effecting the heat transfer is by means of a thermal sink, one face of which is in direct heat-transfer contact with the hot face and, another face of which is in direct heat transfer with the enveloping medium. Advantageously, the thermal sink consists in aluminum, or like heat-conducting material, or in a heat pipe having a radiating surface in contact with the enveloping medium.

The invention has particular advantage when applied to a boat, or like watercraft, where the enveloping medium is ambient water. More efficient cooling is obtained in this combination because the ambient water temperature is usually considerably lower than the ambient atmospheric temperature. In one form of the invention, the other face of the thermal sink is completely submerged in the ambient water.

It is sometimes of advantage, however, to have the other face of the thermal sink in contact with the atmospheric air. This is of particular advantage if the exposed face is so located that it is lapped by the water, for example, when the boat is at rest or, splashed by the water, for example, when the boat is traveling. In this way, the exposed surface is periodically coated with a spray of water and further cooling effect is obtained by the heat of vaporization of the water.

Ordinarily, the external heat sink comprises the hull of the boat, so that the heat is transferred from the hot face through the hull to the ambient water. If desired, however, the external thermal sink can be looped on the side or transom of the watercraft, especially when a heat pipe is used as the external thermal sink.

BRIEF DESCRIPTION OF THE DRAWINGS

In the drawings:

FIG. 1 is a cross-sectional view of a side elevation of one form of the invention;

FIG. 4 is a cross-sectional view in side elevation of another form of the invention;

FIG. 5 is a detailed view of a modification of FIG. 4;

FIG. 6 is a cross-sectional view in side elevation of another form of the invention;

FIG. 7 is a detailed view of a modified form of FIG. 6.

FIG. 8 is a detailed view of a modified form of FIG. 1.

FIG. 9 is a cross-sectional view in side elevation of another form of the invention.

Figure 3:
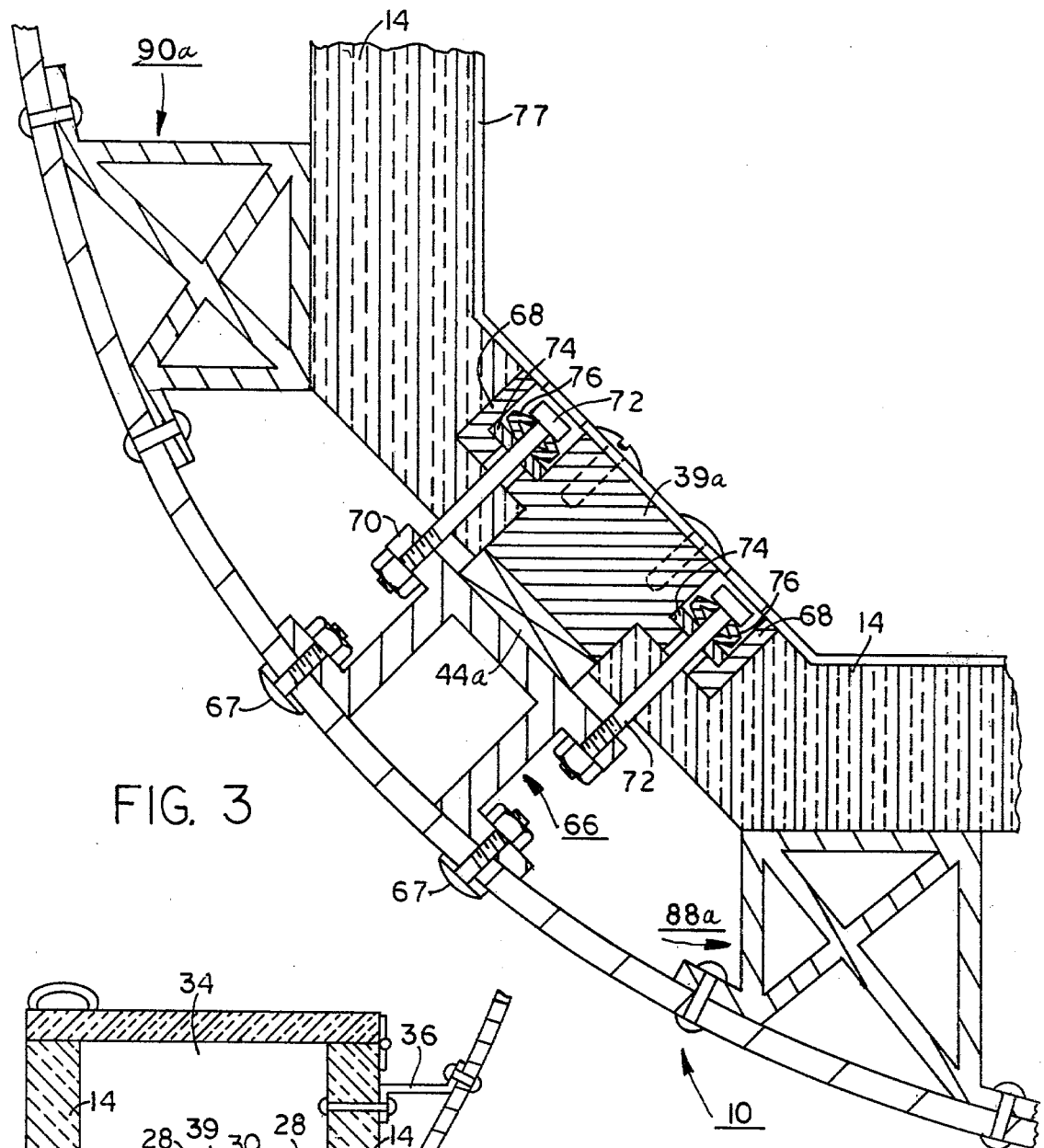
FIG. 3 is a cross-sectional view in side elevation of another form of the invention.

In the drawings, the invention will be illustrated with reference to a boat, or like watercraft, in which only a portion of an exterior hull thereof will be illustrated. It is to be understood, however, that like construction can be utilized in applying the invention to an automobile or to an airplane, or like motor vehicle. Like numbers will be used to identify like parts.

Referring now more particularly to FIG. 1, there is shown at 10 a portion of the exterior wall of the hull of a watercraft in which the hull is made of metal or other conductive material. A refrigerator unit 12 having insulating walls 14 is fastened to the hull 10 by rivets 16, or any other suitable fastening means. The insulated walls are contoured to the shape of the hull, so that the space between the main compartment 18 of the refrigerator and the hull is completely filled by insulating material, except adjacent the hot face of the thermo-electric element.

Disposed within the main compartment 18 is an auxiliary compartment 20 made of aluminum, or like heat-conducting material. One wall, 22, thereof is essentially parallel to the hull at 24 and has disposed between it and the portion 24 of the hull a thermo-electric element 26 held in compression between the wall 22 and the portion 24 of the hull by tie bolts 28 which, advantageously, are made of material of low heat-transfer capacity, such as stainless steel or nylon.

The thermo-electric unit 26 is connected to a source (not shown) of direct current potential in accordance with standard practice in the art. When this potential is imposed on the thermo-electric element in the right polarity, the face 30 becomes hot and the face 32 becomes cold. Heat from the main compartment 18 is thus transferred into walls of the container compartment 20, thence to the sloping wall 22, thence across the thermo-electric element to the hot face 30, thence into the portion 24 of the hull 10 which, together with the rest of the hull and the ambient water, acts as an efficient thermal sink.

In this modification, the refrigerator is so located that the water level is in a position shown, reaching up to about the middle of the portion 24, which is opposed to the hot face of the thermo-electric element 26. The water level may be somewhat lower, but it should be at such a level that, when the lapping of the water due to waves, the portion 24 is periodically coated with a film of water, so that there is direct transfer of heat into the water and also dissipation of heat in the form of the latent heat of vaporization of water.

By locating the refrigerator fore or aft, the exposed portion 24 can be adjusted so that, when the boat or watercraft is traveling, water will be sprayed or splashed on the exposed portion 24 whereby, increased evaporation and transfer of heat into latent heat of vaporization of water is effected by the fanning of the water-coated portion.

The auxiliary compartment 20 functions as a freezing compartment when a thermo-electric element of proper size is used.

Figure 2:
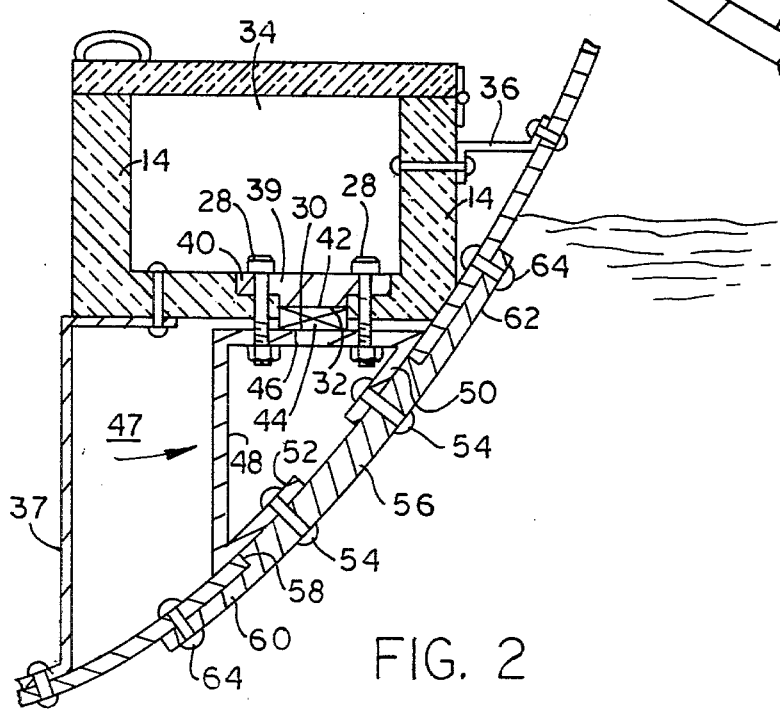
FIG. 2 is a cross-sectional view in side elevation of another form of the invention.

In FIG. 2 there is shown a modified form of the invention in which the heat transfer is effected to a portion of the boat well below the water level. The refrigerator unit comprises a box-shaped container 34 having insulated walls 14 which are fastened to the hull of the boat by suitable brackets 36 and 37.

In the bottom of the container is a thermal sink 39 having a peripheral flange 40 adapted to seat in a complementary champfer in the bottom wall. The heat sink 39 has a flat face 42 adapted for surface-to-surface contact with the cold face 32 of the thermo-electric element 44. The other face, that is, the hot face 30 of the thermo-electric element 44, rests on the upper flat surface 46 of a channel member 47 having downstanding legs 48 and 50. The leg 50 slopes to conform to the slope of the hull fastened thereto by rivets 57 and leg 48 has an inturned portion 52 also conforming to the shape of the hull at that point. Fastened to the leg 50 and the extension 52 by rivets 54, or the like, is a metal plate 56 of a shape to fit into a cut-out portion 58 in the hull. It also has overlying flanges 60 and 62, whereby it can be riveted to the hull by rivets 64. The thermo-electric element 44 is placed under compression between the thermal sink 39 and the thermal sink 44 by means of suitable tie bolts 28, as in FIG. 1.

Thus, heat is extracted from the insulated box 34 into the channel member 47 and thence into the metal plate 56. Thus, the channel member 47 and the metal plate 56 together form a thermal sink for the hot side of the thermo-electric element 44 and effective heat transfer is obtained because the metal plate 56 is in contact with ambient water. Consequently, radiating fins are not necessary as heretofore have been required in the prior art devices.

In FIG. 3 there is disclosed another form of the invention in which the exterior thermal sink is composed of a channel member 66 of aluminum, or like heat-conducting metal, which is bolted or riveted or otherwise fastened to the hull of the boat, as at 67. The internal thermal sink 39a has laterally-projecting wings 68 which are opposed to laterally-projecting wings 70 on the channel member 66, so that the two thermal sinks can be drawn together by bolts 72 to place the thermo-electric element 44a under compression between the two thermal sinks, as in FIG. 2. The bolts 72 may be constructed of metal of low heat-conductivity, or they may be insulated from the internal sink 38 by washers 74. Also, it is sometimes desirable to provide spring washers 76 so that the tension can be more easily adjusted.

The refrigerator box has insulated walls 14 at least partially lined with a heat-conducting metal liner 77 which is in heat-transfer contact with the internal thermal sink 39a. If desired, a like liner can be provided in the other modifications of the invention.

In FIG. 4 there is shown another modification which, like FIG. 2, is particularly adapted for boats having a non-metallic hull. In this modification, the internal thermal sink is like that in FIG. 2, but the external thermal sink 78 is made of a solid block of aluminum, which has an undercut or chamfered face 80 adapted to fit into a correspondingly-shaped hole 82 in the hull 10 and to be fastened thereto by suitable screws 84 or other suitable fastening means. In this modification, the heat is dissipated from the rear vertical wall of the compartment 20 horizontally into the ambient atmosphere and the face 80 is so located that it is lapped or splashed with water periodically to facilitate cooling by latent heat of vaporization of water.

FIG. 5 is a modification of FIG. 4, in which the hull 10 is of aluminum or like heat-conducting metal and the block 78a is not inset into the hull, but simply bolted thereto by bolts 84a.

In FIG. 6 there is shown a modified form of the invention in which the hot face of the thermo-electric element 44a is in surface-to-surface contact with one end of a heat pipe 86. The refrigerator container proper is supported by suitable brackets 88 and 90 and the heat pipe 86 projects through a grommet 92 in the hull 10. The heat pipe 94 is of well-known construction in which a hollow pipe is lined by absorbent material 94 and partially filled with a volatile solvent having a boiling point such that it is condensed at a temperature above that of the ambient water and evaporated at temperatures obtaining at the hot face. Thus, vaporized solvent is condensed at the cold end of the heat pipe and is conducted back to the hot end by capillary action of the porous walls, where it is again evaporated, thus completing a cycle in which the heat transfer is augmented by the latent heat of vaporization of the solvent.

In FIG. 4 there is shown a modified construction for attaching a heat pipe, or a solid block of aluminum for that matter. The heat pipe has a peripheral flange 96 at the outer end and a male thread 98 at the inner end. A large nut or a nut with wings 100 is screwed on the threaded end 98 to compress gaskets 102 and 104 into effective tight seal between the heat pipe 96 and the hull 10. A channel-shaped heat sink 39b having flanges 106 opposed to the flanges 100 fits on the thermo-electric element 44a which is clamped between the heat pipe and the internal thermal sink 39b by suitable bolts, as in the other modifications. In this modification, the heat is transferred from the main compartment into the linear 76a into the internal thermal sink 39b, then transferred to the heat pipe 96 by the thermo-electric element 44a in the manner already described.

FIG. 8 is a variation of FIG. 1, in which a portion of the hull is cut out at 108 to expose the hot face 24 of the thermo-electric element directly to the ambient medium. A gasket 110 is placed between the interior wall of the hull and the hot face 24 to effectively prevent seepage of water into the interior of the boat.

In the form of the invention shown in FIG. 9, the exterior wall of the hull 10 is provided with a heat sink 114 having an enlarged head 116 to fit tightly and seal against the hull 112. The heat sink 114 is threaded and is fastened to the inner side of the wall by the nut 118 which is tightened up against an annular gasket 121.

The thermal sink 114 has an interior flat face 122 which is in surface-to-surface contact with the hot face 24 of the thermo-electric element. The cold face of this element is in surface-to-surface contact with a flat face 124 of an internal thermal sink 126 which has outwardly projecting flanges 128. The thermo-electric element is under compression between the two thermal sinks by means of bolts 130 extending from the washer 120 to the ears or flanges 128. The inner end 132 of the internal thermal sink 126 is in flat surface-to-surface contact with the inner end wall 134 of the freezing compartment 20 and is fastened thereto by suitable screws 136. A suitable door 138 closes both the main compartment 118 and the freezing compartment 20.

When the invention is applied to a boat or like watercraft, instead of the external heat sink penetrating the hull, it can loop over the side or the transom as a U-shaped external heat sink. It is of particular advantage in such case, for the heat sink to be a heat pipe having one end in direct heat-transfer contact with the hot face of the thermo-electric element and the other end in direct heat-transfer contact with the ambient water.

It is to be understood that the invention is not to be limited to the exact details of operation or structure shown and described, as obvious modifications and equivalents will be apparent to one skilled in the art.

I claim:

1. In a watercraft having an exterior wall at least part of which is exposed to ambient water, and apparatus within said exterior wall for effecting refrigeration by means of a thermo-electric element having hot and cold faces adapted to be activated by the impression of a direct current potential across said faces, the improvement which comprises static heat-transfer means for conducting heat from said hot face into the water to which said exterior wall is exposed, said static heat-transfer means being openly and unrestrictedly exposed to said water and being free of moving parts and forced circulation of coolant.

2. A watercraft of claim 1 in which said static heat-transfer means consists in a thermal sink of heat-conducting material, one face of which is in direct heat-transfer contact with said hot face and another face of which is a unitary part of said exterior wall and is openly and unrestrictedly exposed to said ambient water.

3. A watercraft of claim 2, in which said other face is also exposed to ambient air and is so located that in operation of said craft, water is filmed thereon and evaporated therefrom by the heat transferred from said hot face, whereby a portion of the the heat transferred from said hot face is converted into latent heat of vaporization of water.

4. A watercraft of claim 2, in which said other face is located entirely below the waterline of said craft so that it is completely submerged in the ambient water in the normal operation of the craft.

5. A watercraft of claim 2, in which said other face is located at least partially above the waterline of said craft and so close thereto that said other face, in the normal operation of said craft, is not completely submerged in the ambient water, but is exposed to both the ambient atmosphere and the ambient water, so that in the normal use and operation of the craft, water is filmed onto at least a portion of said other face and evaporated therefrom by the heat transferred from said hot face, whereby the heat conducted to said other face is dissipated in part into latent heat of vaporization of water.

6. In a method for effecting refrigeration in a watercraft by means of a thermo-electric element having a hot face and a cold face activated by impressing a direct current potential across said faces, the improvement which comprises cooling said hot face by statically conducting heat therefrom to the outside of an exterior wall of said craft through a thermal sink of heat-conducting material and thence into the ambient water which envelopes the outside of said exterior wall without the intervention of moving parts and without forced circulation of coolant.

7. A method of claim 6, in which said other face is also exposed to ambient air and is so located that in operation of said craft, water is filmed thereon and evaporated therefrom by the heat transferred from said hot face, whereby a portion of the heat transferred from said hot face is converted into latent heat of vaporization of water.

8. A method of claim 6, in which said other face is completely enveloped by said water.

9. A method of claim 6 in which said other face is enveloped by both atmospheric air and said water, whereby, in the use and operation of the craft, water is evaporated from said other surface and the heat transferred from said hot face is dissipated in part into latent heat of vaporization of water.

10. A method of claim 6, in which said enveloping medium comprises both water and atmospheric air, and in which water is supplied to said other face intermittently in amounts such that it is evaporated thereon by heat transferred from said hot face so that at least a portion of the transferred heat is converted into latent heat of vaporization of water.

11. In a watercraft having an exterior wall adapted to be at least partially submerged in ambient water, the combination therewith of a refrigerating unit powered by a thermo-electric element characterized in that the hot face of the thermo-electric element is in surface-to-surface contact with one face of a heat-conducting thermal sink, the other face of which is comprised in and constitutes a unitary portion of said exterior wall which is openly and unrestrictedly exposed to heat exchange contact with said ambient water.

12. A watercraft of claim 11, in which said exterior wall has a unitary portion thereof which comprises the portion of said external thermal sink which is in heat-exchange contact with said ambient water.

13. A watercraft of claim 11, in which said thermal sink comprises a heat pipe having one end in surface-to-surface contact with the hot face of said thermo-electric element and the other end constituting the portion of said exterior wall which is in heat-exchange contact with said ambient water.

14. A watercraft of claim 11, in which said unitary portion is a smooth continuation of the surrounding portions of said exterior wall.

15. A watercraft of claim 11, in which said unitary portion is an integral part of said exterior wall and in which said integral part is a smooth continuation of the surrounding portions of said exterior wall.

16. A watercraft of claim 11, in which the exterior surface of said exterior wall is composed of non-heat-conducting material and in which said thermal sink extends through said exterior wall, is arranged for open and unrestricted heat-exchange contact with said ambient water, and is a unitary part of said exterior wall.

17. In a device which is cooled by a thermo-electric element having hot and cold faces adapted to be activated by the impression of direct current potential across said faces and in which the heat from said hot face is dissipated into an external thermal sink and from there into ambient air, the improvement which comprises means for deliberately bringing water in contact with said external thermal sink while it is exposed to the ambient air in such a manner that the water is evaporated from said external thermal sink, whereby heat in said external thermal sink is dissipated as latent heat of vaporization of water.

18. In a method in which cooling is effected by a thermo-electric element having hot and cold faces adapted to be activated by the impression of direct current potential across said faces and in which the heat from said hot face is dissipated into an external thermal sink and from there into ambient air, the improvement which comprises deliberately applying water to said external thermal sink while it is exposed to the ambient air and evaporating at least a portion thereof while the water is in contact with said external thermal sink, whereby heat in said external thermal sink is dissipated as latent heat of vaporization of water.

* * * * *

UNITED STATES PATENT AND TRADEMARK OFFICE
CERTIFICATE OF CORRECTION

PATENT NO. : 4,355,518

DATED : October 26, 1982

INVENTOR(S) : Shlomo Beitner

It is certified that error appears in the above-identified patent and that said Letters Patent is hereby corrected as shown below:

Cover page, Title, [54]; "REFRIGERATOR-VEHICLE COMBINATION METHOD" should read -- REFRIGERATOR-VEHICLE COMBINATION AND METHOD --

Col. 6, line 32; after "said" insert -- ambient --

Col. 6, line 36; delete "and" and insert -- so that --

Signed and Sealed this

Fifth Day of April 1983

[SEAL]

Attest:

GERALD J. MOSSINGHOFF

Attesting Officer     Commissioner of Patents and Trademarks